United States Patent
Forsyth, Jr.

(10) Patent No.: US 12,381,557 B1
(45) Date of Patent: Aug. 5, 2025

(54) FAULT DETECTION AND AUTOMATIC SWITCHING OF RELAYS

(71) Applicant: Forsyth Robotics LLC, Richmond, VA (US)

(72) Inventor: John McGregor Forsyth, Jr., Memphis, TN (US)

(73) Assignee: Forsyth Robotics LLC, Richmond, VA (US)

(*) Notice: Subject to any disclaimer, the term of this patent is extended or adjusted under 35 U.S.C. 154(b) by 0 days.

(21) Appl. No.: 18/361,863

(22) Filed: Jul. 30, 2023

Related U.S. Application Data

(60) Provisional application No. 63/505,086, filed on May 31, 2023, provisional application No. 63/393,457, filed on Jul. 29, 2022.

(51) Int. Cl.
| | |
|---|---|
| *H01H 71/12* | (2006.01) |
| *G01R 31/327* | (2006.01) |
| *H01H 47/00* | (2006.01) |
| *H01H 71/10* | (2006.01) |
| *H03K 19/003* | (2006.01) |
| *H01H 71/04* | (2006.01) |

(52) U.S. Cl.
CPC ... *H03K 19/00392* (2013.01); *G01R 31/3278* (2013.01); *H01H 47/005* (2013.01); *H01H 71/1081* (2013.01); *H01H 71/125* (2013.01); *H01H 2071/048* (2013.01)

(58) Field of Classification Search
CPC ...... H01H 47/002; H01H 1/0015; H01H 1/60; H02H 7/30; H02H 7/262; H02H 7/22; H02H 3/08; H02H 3/28; H02H 3/335
See application file for complete search history.

(56) References Cited

U.S. PATENT DOCUMENTS

| | | | | |
|---|---|---|---|---|
| 5,757,598 A | * | 5/1998 | Aromin | H01H 47/04 361/42 |
| 2005/0018371 A1 | * | 1/2005 | Mladenik | H02H 3/00 361/78 |
| 2014/0300481 A1 | * | 10/2014 | Overton | G08B 21/185 361/187 |

* cited by examiner

*Primary Examiner* — Bryan R Perez
(74) *Attorney, Agent, or Firm* — Sprinkle IP Law Group

(57) ABSTRACT

An apparatus including one or more relays and a fault detector is disclosed. The one or more relays are coupled to a load. The fault detector is coupled with the one or more relays and receives at least one control signal. The fault detector includes a sensor to detect electricity flowing through the load and generate a detection signal. Based on a comparison of the control signal and the detection signal, the fault detector generates a fault signal indicative of whether a relay is functional or faulty.

15 Claims, 10 Drawing Sheets

FAULT DETECTION AND AUTOMATIC SWITCHING OF RELAYS

CROSS REFERENCE TO RELATED APPLICATIONS

This application claims the benefit of U.S. provisional application Ser. No. 63/505,086, filed May 31, 2023, entitled ELECTROMECHANICAL RELAY WITH FAULT DETECTION AND AUTOMATED REDUNDANCY and U.S. provisional application Ser. No. 63/393,457 filed Jul. 29, 2022, entitled ELECTROMECHANICAL RELAY WITH FAULT DETECTION AND AUTOMATED REDUNDANCY which are hereby incorporated by reference herein in their entirety.

TECHNICAL FIELD

Various embodiments of the disclosure relate generally to relays. More specifically, various embodiments of the disclosure relate to relays, such as electromechanical relays, with fault detection and automated redundancy.

BACKGROUND

Relays represent fundamental components utilized in electronic control systems, serving as devices to facilitate the opening or closing of electrical circuits. Two predominant variations of relays which are widely utilized are an electromechanical relay and a solid-state relay. The electromechanical relay operates through an electromagnet that effectuates the opening or closing of the circuit. In contrast, the solid-state relay achieves the same functionality without relying on moving parts, presenting a distinct advantage in terms of durability and longevity. Both types of relays function as switches, enabling the completion or interruption of electrical circuits. The completion of an electrical circuit permits the flow of electricity, while its interruption prevents the passage of electrical current.

Automated systems extensively employ relays to regulate circuits with differing voltage levels, employing a lower voltage control signal to control higher voltage circuits. For instance, modern-day devices typically incorporate computing devices to manage various functions. When the computing device necessitates activating a sizeable motor, a relay intervenes to enable the computing device to emit a signal capable of engaging the motor.

However, the reliability of relay components may become a crucial concern, as their failure may lead to malfunctions and disruptions in various applications. Relay malfunctioning may occur in two distinct manners: either the circuit fails to close, rendering the relay ineffective in completing the electrical circuit, or the circuit remains unable to open, causing a perpetual flow of electricity. Such occurrences can cause substantial downtime in industrial settings, impair the proper functioning of vehicles, or disrupt the intended operation of home automation systems.

Therefore, in the light of the foregoing, there exists a need for a technical and reliable solution that overcomes the above-mentioned problems, challenges, and shortcomings of conventional relays.

SUMMARY

In one embodiment of the present disclosure is an apparatus for fault detection and automated redundancy in relays. An apparatus comprising a controller, first and second relays, and a fault detector is described. The controller is configured to generate a set of control signals. The first relay coupled to a load. The second relay coupled to the load. The fault detector is coupled to the controller, the first relay, and the second relay, and configured to receive at least one of the sets of control signals and generate a first fault signal and a second fault signal. When the first fault signal indicates that the first relay is functional, the first relay is configured to control the load. When the first fault signal indicates that the first relay is faulty, the second relay is configured to control the load.

Additionally, or optionally, each of the first and second relay comprises first and second switches. The first switch having a first contact. The second switch having a second contact coupled with the first contact by way of a non-conductive material. The first and second switches are activated and deactivated simultaneously. The first switch controls a first circuit, and the second switch controls a second circuit including the load. The first switch is configured to generate a detection signal. The fault detector generates one of: the first fault signal and the second fault signal based on comparison of the detection signal and at least one of the control signals.

Additionally, or optionally, the fault detector further comprises a logic gate configured to compare the detection signal and at least one of the control signals to generate one of the first and second fault signals. When a logic level of the detection signal is same as a logic level of at least one of the control signals, the corresponding fault signal generated indicates that the respective relay is functional. When the logic level of the detection signal is different than the logic level of at least one of the control signals, the corresponding fault signal generated indicates that the respective relay is faulty.

Additionally, or optionally, the fault detector comprises first and second fault detection circuits. The first fault detection circuit comprising a first fault indicator that is configured to receive the first fault signal and indicate whether the first relay is one of functional and faulty. The second fault detection circuit comprising a second fault indicator that is configured to receive the second fault signal and indicate whether the second relay is one of functional and faulty.

Additionally, or optionally, each of the first and second fault indicators comprise a light emitting diode to indicate whether the first and second relays are one of functional and faulty.

Additionally, or optionally, the controller is further configured to receive the first and second fault signals.

Additionally, or optionally, the set of control signals comprise first and second control signals. The first fault detection circuit is configured to receive the first control signal to one of activate and deactivate the first relay and the second fault detection circuit is configured to receive the second control signal to one of activate and deactivate the second relay. When the first fault signal indicates that the first relay is faulty, the controller generates the first and second control signals such that the first relay is deactivated and the second relay is activated to control the load, thereby switching the control of the load from the first relay to the second relay.

Additionally, or optionally, the fault detector comprises an antenna configured to detect one of: a presence and an absence of electricity flowing through the load and generate a detection signal. The fault detector generates the first and second fault signals based on a comparison of the detection signal and at least one of the control signals.

Additionally, or optionally, the fault detector comprises a hall sensor configured to detect one of: a presence and an absence of electricity flowing through the load and generate a detection signal. The fault detector generates the first and second fault signals based on a comparison of the detection signal and at least one of the control signals.

Additionally, or optionally, the apparatus further comprising a control circuit that is coupled to the controller, the first and second relays, and the fault detector, and configured to: receive at least one of the control signals and the detection signal, generate and provide an output signal to the first relay to control the load, compare the detection signal and at least one of the control signals, and automatically switch the output from the first relay to the second relay based on the comparison of the detection signal and at least one of the control signals.

Additionally, or optionally, the control circuit is one of: a microcontroller and an electrical circuit comprising of a plurality of components to switch the output from the first relay to the second relay when the first relay is faulty.

Additionally, or optionally, the fault detector further comprises a logic gate configured to compare the detection signal and at least one of the control signals to generate one of the first and second fault signals. When a logic level of the detection signal is same as a logic level of at least one of the control signals, the corresponding fault signal generated indicates that the respective relay is functional. When the logic level of the detection signal is different than the logic level of at least one of the control signals, the corresponding fault signal generated indicates that the respective relay is faulty.

Additionally, or optionally, the fault detector comprises first and second fault detecting circuits. Each of the first and second fault detecting circuits comprises a pass through fault detector coupled to at least one of the first relay and the second. The pass through fault detector comprises a first input terminal coupled with the controller to receive at least one of the set of control signals, a first output terminal coupled with a first input terminal of one of the first and second relay, a second input terminal coupled to the load, and a second output terminal coupled to a second input terminal of one of the first and second relay.

Additionally, or optionally, each of the first and second fault detecting circuits further comprises a fault indicator coupled to the pass-through fault detector, and configured to receive at least one of the first and second fault signals and indicate whether at least one of the first and second relays is one of functional and faulty.

Additionally, or optionally, each of the first and second relays is one of: an electromechanical relay, a solid state relay, and a single pole single throw relay.

In another embodiment of the present disclosure, an apparatus is provided for fault detection and automated redundancy in relays. The apparatus comprises a controller, first and second relays, and first and second fault detection circuits. The controller configured to generate first and second control signals. The first relay coupled to a load and configured to receive the first control signal and generate the first detection signal. The second relay coupled to the load and configured to receive the second control signal and generate the second detection signal. The first fault detecting circuit coupled to the controller and the first relay, and configured to receive the control signal and the first detection signal and generate a first fault signal. The second fault detecting circuit coupled to the controller and the second relay, and configured to receive the control signal and the second detection signal and generate a second fault signal. When the first fault signal indicates that the first relay is functional, the first relay is configured to control the load. When the first fault signal indicates that the first relay is faulty, the second relay is configured to control the load.

In yet another embodiment of the present disclosure, a method is provided for fault detection and automated redundancy in relays. The method includes generating a first control signal to trigger a first relay to control a load, energizing a first coil of the first relay, activating a first switch of the first relay to close a first contact of the first switch to generate a detection signal, and activating a second switch of the second relay to close a second contact of the second switch to control the load. The method further includes comparing the first control signal with the detection signal to generate a first fault signal and generating a second control signal to trigger a second relay to control the load when the first fault signal indicates that the first relay is faulty, thereby switching the control of the load from a faulty relay to a functional relay.

Various embodiments of the present disclosure provide the apparatus and method that facilitates several advantages for fault detection and automated redundancy in relays. Firstly, the apparatus provides a comprehensive solution with circuits that may be integrated into relays, allowing for convenient detection. The fault indicators, which may be light emitting diodes, offer a clear and intuitive means of communicating the detected fault in a relay. Additionally, the apparatus supports automatic switching from a faulty relay to a functional relay.

BRIEF DESCRIPTION OF THE DRAWINGS

The illustrated embodiments of the subject matter will be best understood by reference to the drawings, wherein like parts are designated by like numerals throughout. The following description is intended only by way of example, and illustrates certain selected embodiments of devices, systems, and processes that are consistent with the subject matter as claimed herein.

DETAILED DESCRIPTION

Figure 1:
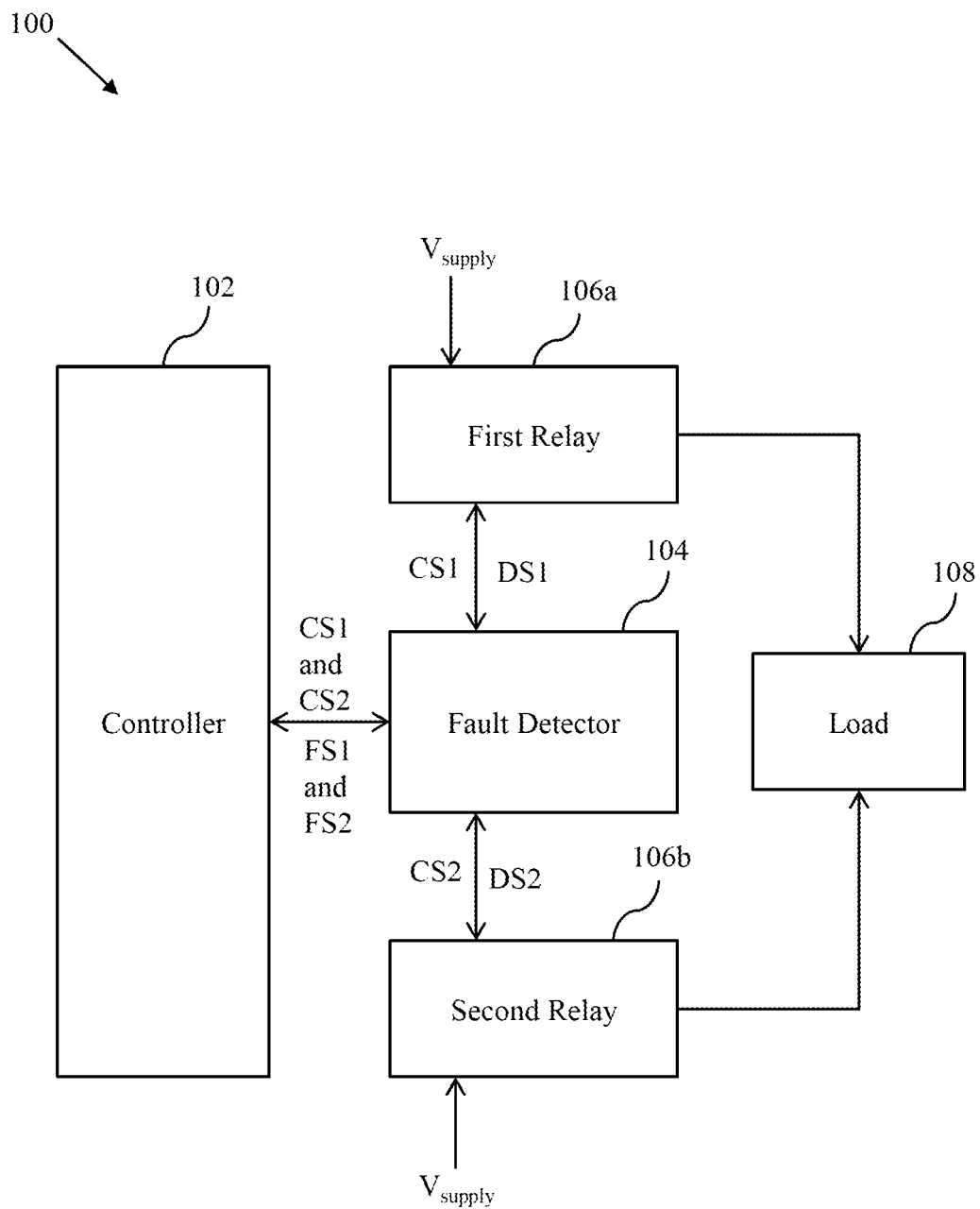
FIG. 1 is a block diagram of an apparatus for detecting faults in relays and switching between relays, in accordance with an embodiment of the present disclosure.

Example apparatus are described herein. Other example embodiments or features may further be utilized, and other changes may be made, without departing from the spirit or scope of the subject matter presented herein. In the following detailed description, reference is made to the accompanying drawings, which form a part thereof.

The example embodiments described herein are not meant to be limiting. It will be readily understood that the aspects of the present disclosure, as generally described herein, and illustrated in the drawings, can be arranged, substituted, combined, separated, and designed in a wide variety of different configurations, all of which are explicitly contemplated herein.

FIG. 1 is a block diagram of an apparatus 100 for detecting faults in relays and switching between relays, in accordance with an embodiment of the present disclosure. The apparatus 100 may be utilized in automotive applications such as an advanced driver alert system (ADAS), consumer applications such as a home automation system, or industrial applications such as an industrial robotic system. The apparatus 100 includes a controller 102, a fault detector 104, first and second relays 106a and 106b, and a load 108.

The controller 102 is configured to generate a set of control signals and receive first and second fault signals FS1 and FS2. In one embodiment, the set of control signals include first and second control signals CS1 and CS2. The first control signal CS1 is generated to trigger the first relay 106a and the second control signal CS2 is generated to trigger the second relay 106b. The first fault signal FS1 indicates whether the first relay 106a is one of functional and faulty and the second fault signal FS2 indicates whether the second relay 106b is one of functional and faulty. The controller 102 may include suitable logic, circuitry, interfaces, and/or codes, executable by the circuitry, that may be configured to perform the one or more operations for detecting faults in relays and switching between relays. Examples of the controller 102 include, but are not limited to, a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure.

The fault detector 104 is coupled to the controller 102 and configured to receive the set of control signals, such as the first and second control signals CS1 and CS2. The fault detector 104 is further configured to provide the first control signal CS1 to the first relay 106a and the second control signal CS2 to the second relay 106b. In one embodiment, the first control signal CS1 is provided to the first relay 106a when the first control signal CS1 is at logic high level (e.g., logic "1") and the second control signal CS2 is provided to the second relay 106b when the second control signal CS2 is at logic high level. The fault detector 104 is further configured to receive first and second detection signals DS1 and DS2 and generate the first fault signal FS1 based on the first control signal CS1 and the first detection signal DS1 and the second fault signal FS2 based on the second control signal CS2 and the second detection signal DS2. In one example, when the first fault signal FS1 is at logic low level (e.g., logic "0"), the first relay 106a is functional and when the first fault signal FS1 is at logic high level, the first relay 106a is faulty. Similarly, when the second fault signal FS2 is at logic low level, the second relay 106b is functional and when the second fault signal FS2 is at logic high level, the second relay 106b is faulty. The fault detector 104 is further configured to provide the first and second fault signals FS1 and FS2 to the controller 102.

The first relay 106a is coupled to the fault detector 104 and is configured to receive the first control signal CS1. The first relay 106a is further coupled to the load 108 and is configured to control the load 108. In one embodiment, when the first control signal CS1 is at logic high level, the first relay 106a is triggered to control the load 108. The first relay 106a is further configured to generate the first detection signal DS1 based on the triggering of the first relay 106a. In one embodiment, when the first control signal CS1 is at logic high level and the first relay 106a is triggered to control the load 108, the first detection signal DS1 is generated at logic high level. Further, when the first control signal CS1 is at logic low level, the first detection signal DS1 is generated at logic low level.

The second relay 106b is coupled to the fault detector 104 and is configured to receive the second control signal CS2. The second relay 106b is further coupled to the load 108 and is configured to control the load 108. In one embodiment, when the second control signal CS2 is at logic high level, the second relay 106b is triggered to control the load 108. The second relay 106b is further configured to generate the second detection signal DS2 based on the triggering of the second relay 106b. In one embodiment, when the second control signal CS2 is at logic high level and the second relay 106b is triggered to control the load 108, the second detection signal DS2 is generated at logic high level. Further, when the second control signal CS2 is at logic low level, the second detection signal DS2 is generated at logic low level. Examples of the first and second relays 106a and 106b include, but are not limited to, an electromechanical relay, a solid state relay, and a double pole single throw (DPST) relay.

The load 108 may be any suitable circuit that is controlled by the first and second relays 106a and 106b. In one example, the load 108 is a direct current (DC) circuit. In another example, the load 108 is an alternate current (AC) circuit.

In operation, when the controller 102 generates the first control signal CS1 at logic high level and the fault detector 104 receives and provides the first control signal CS1 at logic high level to the first relay 106a, the first relay 106a is triggered to control the load 108. Further, the first relay 106a generates the first detection signal DS1 at logic high level. The fault detector 104 receives the first detection signal DS1 and is configured to compare the first control signal CS1 and the first detection signal DS1 to generate the first fault signal FS1. In one embodiment, when a logic level of the first detection signal DS1 is the same as a logic level of the first control signal CS1, the first fault signal FS1 generated indicates that the first relay 106a is functional. Further, when the logic level of the first detection signal DS1 is different than the logic level of the first control signal CS1, the first fault signal FS1 generated indicates that the first relay 106a is faulty.

In one scenario, when the first relay 106a is functional and the first control signal CS1 is generated at logic high level, the first relay 106a is triggered and generates the first detection signal DS1 at logic high level. The fault detector 104 determines that both the first control signal CS1 and the first detection signal DS1 are at logic high level and generates the first fault signal FS1 at logic low level to indicate that the first relay 106a is functional. However, when the first relay 106a is faulty such that the first relay 106a is in a stuck open state and the first control signal CS1 is generated at logic high level, the first relay 106a is not triggered and generates the first detection signal DS1 at logic low level. The fault detector 104 determines that the first control signal CS1 and the first detection signal DS1 are at different logic levels and generates the first fault signal FS1 at logic high level to indicate that the first relay 106a is faulty.

Similarly, when the first relay 106a is functional and the first control signal CS1 is generated at logic low level, the first relay 106a is not triggered and generates the first detection signal DS1 at logic low level. The fault detector 104 determines that both the first control signal CS1 and the first detection signal DS1 are at logic low level and generates the first fault signal FS1 at logic low level to indicate that the first relay 106a is functional. However, when the first relay 106a is faulty such that the first relay 106a is in a fused shut state and the first control signal CS1 is generated at logic low level, the first relay 106a is triggered and generates the first detection signal DS1 at logic high level. The fault detector 104 determines that the first control signal CS1 and the first detection signal DS1 are at different logic levels and generates the first fault signal FS1 at logic high level to indicate that the first relay 106a is faulty.

When the first relay 106a is faulty, the first relay 106a is unable to control the load 108 as desired and the control of the load 108 is switched to the second relay 106b which is functional. When the control of the load 108 is switched to the second relay 106b, the second control signal CS2 is generated at logic high level which triggers the second relay 106b to control the load 108. When the controller 102 generates the second control signal CS2 at logic high level and the fault detector 104 receives and provides the second control signal CS2 at logic high level to the second relay 106b, the second relay 106b is triggered to control the load 108. Further, the second relay 106b generates the second detection signal DS2 at logic high level. The fault detector 104 receives the second detection signal DS2 and is configured to compare the second control signal CS2 and the second detection signal DS2 to generate the second fault signal FS2. In one embodiment, when a logic level of the second detection signal DS2 is the same as a logic level of the second control signal CS2, the second fault signal FS2 generated indicates that the second relay 106b is functional. Further, when the logic level of the second detection signal DS2 is different than the logic level of the second control signal CS2, the second fault signal FS2 generated indicates that the second relay 106b is faulty.

In one scenario, when the second relay 106b is functional and the second control signal CS2 is generated at logic high level, the second relay 106b is triggered and generates the second detection signal DS2 at logic high level. The fault detector 104 determines that both the second control signal CS2 and the second detection signal DS2 are at logic high level and generates the second fault signal FS2 at logic low level to indicate that the second relay 106b is functional. However, when the second relay 106b is faulty such that the second relay 106b is in a stuck open state and the second control signal CS2 is generated at logic high level, the second relay 106b is not triggered and generates the second detection signal DS2 at logic low level. The fault detector 104 determines that the second control signal CS2 and the second detection signal DS2 are at different logic levels and generates the second fault signal FS2 at logic high level to indicate that the second relay 106b is faulty.

Similarly, when the second relay 106b is functional and the second control signal CS2 is generated at logic low level, the second relay 106b is not triggered and generates the second detection signal DS2 at logic low level. The fault detector 104 determines that both the second control signal CS2 and the second detection signal DS2 are at logic low level and generates the second fault signal FS2 at logic low level to indicate that the second relay 106b is functional. However, when the second relay 106b is faulty such that the second relay 106b is in a fused shut state and the second control signal CS2 is generated at logic low level, the second relay 106b is triggered and generates the second detection signal DS2 at logic high level. The fault detector 104 determines that the second control signal CS2 and the second detection signal DS2 are at different logic levels and generates the second fault signal FS2 at logic high level to indicate that the second relay 106b is faulty.

In one embodiment, the fault detector 104 may include a fault indicator to indicate that the first relay 106a is one of functional and faulty and the second relay 106b is one of functional and faulty. The fault indicator may be one of a visual indicator, an audio indicator, a tactile indicator, or a combination thereof.

Figure 2:
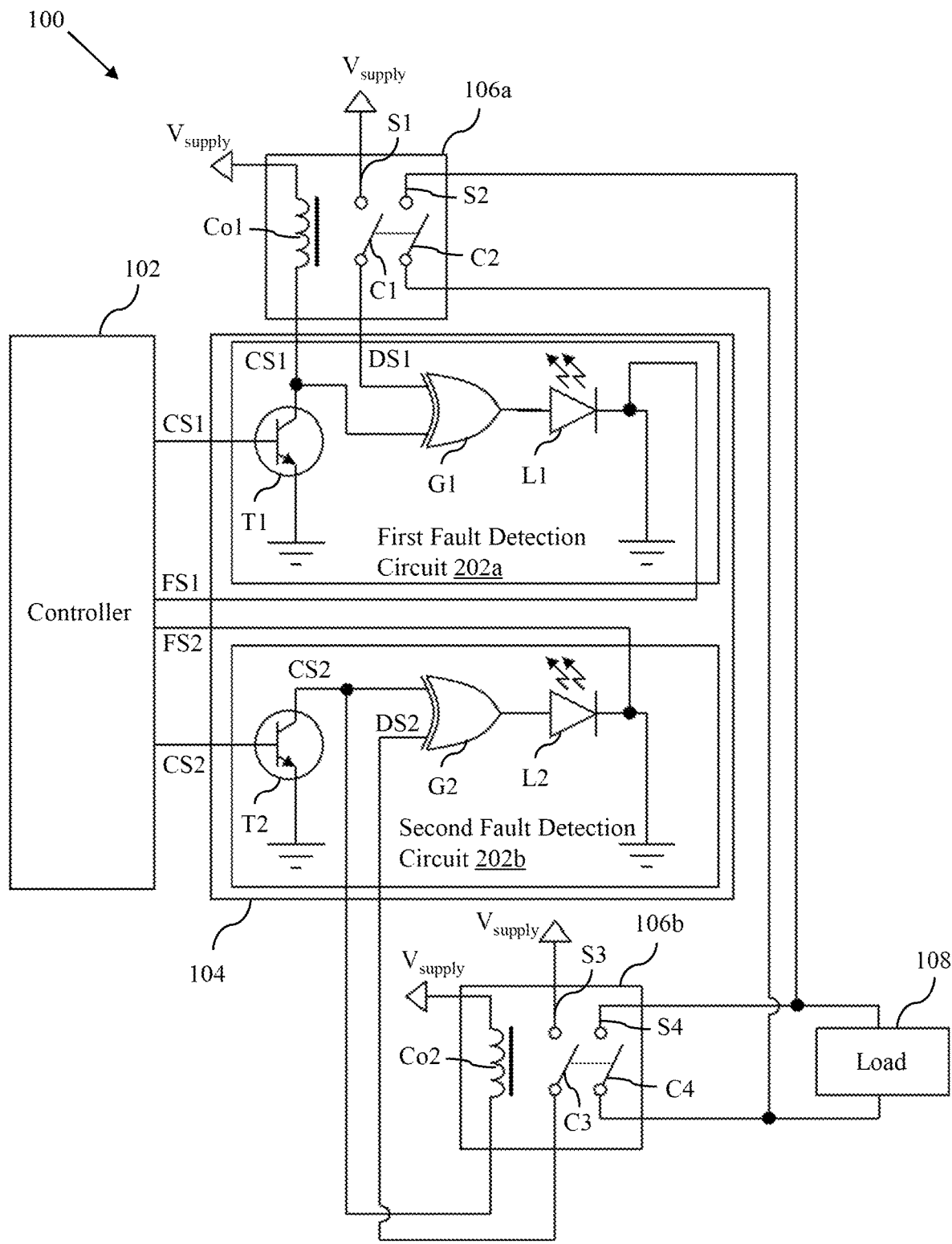
FIG. 2 is a circuit diagram of the apparatus of FIG. 1 for detecting faults in relays and switching between relays, in accordance with an embodiment of the present disclosure.

FIG. 2 is a circuit diagram of the apparatus 100 for detecting faults in relays and switching between relays, in accordance with an embodiment of the present disclosure. In this embodiment, the first and second relays 106a and 106b are electromechanical relays.

The fault detector 104 includes first and second fault detection circuits 202a and 202b. The first fault detection circuit 202a is coupled to the controller 102 to receive the first control signal CS1 and generate and provide the first fault signal FS1 to the controller 102. The first fault detection circuit 202a is further coupled to the first relay 106a and configured to provide the first control signal CS1 and receive the first detection signal DS1. The first fault detection circuit 202a includes a first transistor T1, a first logic gate G1, and a first fault indicator L1.

The first transistor T1 has a base terminal coupled to the controller 102 and configured to receive the first control signal CS1, a collector terminal coupled to the first relay 106a and the first logic gate G1 and configured to provide the first control signal CS1 to the first relay 106a, and an emitter terminal coupled to ground. In one embodiment, the first transistor T1 acts as a switch. When the first control signal CS1 is generated at logic low level, the first transistor T1 is inactive and does not trigger the first relay 106a to control the load 108. Further, when the first control signal CS1 is generated at logic high level, the first transistor T1 is active and provides the first control signal CS1 to the first relay 106a to trigger the first relay 106a to control the load 108. In one embodiment, the first transistor T1 is an NPN transistor. It will be apparent to a person skilled in the art that although in the current embodiment, the first transistor T1 is an NPN transistor, in alternate embodiments, the first transistor T1 may be a PNP transistor, without deviating from the scope of the present disclosure. Examples of the first transistor T1 include, but are not limited to, a bipolar junction transistor (BJT), a field effect transistor (FET), a metal oxide semiconductor FET (MOSFET), and a junction FET (JFET).

The first logic gate G1 has a first terminal coupled to the first relay 106a and configured to receive the first detection signal DS1, and a second terminal coupled to the collector terminal of the first transistor T1 and configured to receive the first control signal CS1. In one embodiment, the first logic gate G1 is an exclusive OR (XOR) gate. The first logic gate G1 further has an output terminal coupled with the first fault indicator L1 and the controller 102 and configured to generate the first fault signal FS1 based on the comparison of the first control signal CS1 and the first detection signal DS1. When both the first control signal CS1 and the first detection signal DS1 are at the same logic level, such as logic high level or logic low level, the first logic gate G1 generates the first fault signal FS1 at logic low level. Further, when the first control signal CS1 and the first detection signal DS1 are at different logic levels, such as one is at logic high level and other is at logic low level, the first logic gate G1 generates the first fault signal FS1 at logic high level. It will be apparent to a person skilled in the art that although in the current embodiment, the first logic gate G1 is an XOR gate, in alternate embodiments, the first logic gate G1 may be any suitable logic gate or a combination of multiple logic gates, without deviating from the scope of the present disclosure.

The first fault indicator L1 has a first terminal coupled to the output terminal of the first logic gate G1 and is configured to receive the first fault signal FS1 and a second terminal coupled to ground. In one embodiment, when the first fault signal FS1 is at logic low level, the first fault indicator L1 indicates that the first relay 106a is functional. Further, when the first fault signal FS1 is at logic high level, the first fault indicator L1 indicates that the first relay 106a is faulty. In the embodiment the first fault indicator L1 is a visual indicator such as a light emitting diode (LED) that is turned OFF when the first relay 106a is functional and the is turned ON when the first relay 106a is faulty. It will be apparent to a person skilled in the art that although in the current embodiment, the first fault indicator L1 is a visual indicator such as an LED, in alternate embodiments, the first fault indicator L1 may be any suitable indicator such as an audio indicator, a tactile indicator or a combination of multiple indicators, without deviating from the scope of the present disclosure.

The first relay 106a includes a first coil Co1 having a first terminal coupled to a power supply (not shown) and configured to receive a supply voltage Vsupply, and a second terminal coupled to the collector terminal of the first transistor T1 to receive the first control signal CS1. The first relay 106a further includes first and second switches S1 and S2. The first switch S1 has a first contact C1, a first terminal coupled to the power supply and configured to receive the supply voltage Vsupply, and a second terminal coupled to the first terminal of the first logic gate G1 and configured to provide the first detection signal DS1 to the first logic gate G1. Thus, the power supply, the first switch S1, and the first logic gate G1 act as a first circuit such that the first switch S1 controls the first circuit. The second switch S2 has a second contact C2, and first and second terminals coupled to the load 108 and configured to control the load 108. Thus, the second switch S2 and the load 108 act as a second circuit such that the second switch S2 controls the second circuit. The second contact C2 is coupled with the first contact C1 by way of a non-conductive material such that the first and second switches S1 and S2 are mechanically linked and are in an open state and a closed state simultaneously.

In one scenario, when the first relay 106a is functional and when the first control signal CS1 is at logic high level, the first coil Co1 is energized and triggers the first and second switches S1 and S2 to activate (e.g., to be in the closed state), thereby completing the first and second circuits. The first detection signal DS1 is thus generated at logic high level. Further, when the first relay 106a is functional and when the first control signal CS1 is at logic low level, the first coil Co1 is deenergized and does not trigger the first and second switches S1 and S2, the first and second switches S1 and S2 thus being inactive (e.g., in the open state). The first detection signal DS1 is thus generated at logic low level.

In another scenario, when the first relay 106a is faulty and when the first control signal CS1 is at logic high level, the first coil Co1 is energized and triggers the first and second switches S1 and S2 to activate (e.g., to be in the closed state), however as the first and second switches S1 and S2 are stuck in the open state the first and second switches S1 and S2 remain inactive. The first detection signal DS1 is thus generated at logic low level. Further, when the first relay 106a is faulty and when the first control signal CS1 is at logic low level, the first coil Co1 is deenergized and does not trigger the first and second switches S1 and S2, however as the first and second switches S1 and S2 are stuck at shut closed state, the first and second switches S1 and S2 thus being active (e.g., in the closed state). The first detection signal DS1 is thus generated at logic high level.

The first relay 106a thus controls the load 108 when the first control signal CS1 is at logic high level and the first relay 106a is functional. When the first relay 106a is faulty, the fault detector 104 generates the first fault signal FS1 at logic high level to indicate that the first relay 106a is faulty and provides the first fault signal FS1 to the controller 102. The controller 102 receives the first fault signal FS1. If the first fault signal FS1 indicates to the controller 102 that the first relay 106a is functional, the controller 102 continues generating the first control signal CS1 at logic high level such that the first relay 106a controls the load 108. If the first fault signal FS1 indicates to the controller 102 that the first relay 106a is faulty, the controller 102 switches the control of the load 108 from the first relay 106a to the second relay 106b and generates the first control signal CS1 at logic low level and the second control signal CS2 at logic high level.

The second fault detection circuit 202b is coupled to the controller 102 to receive the second control signal CS2 and generate and provide the second fault signal FS2 to the controller 102. The second fault detection circuit 202b is further coupled to the second relay 106b and configured to provide the second control signal CS2 and receive the second detection signal DS2. The second fault detection circuit 202b includes a second transistor T2, a second logic gate G2, and a second fault indicator L2.

The second transistor T2 has a base terminal coupled to the controller 102 and configured to receive the second control signal CS2, a collector terminal coupled to the second relay 106b and the second logic gate G2 and configured to provide the second control signal CS2 to the second relay 106b, and an emitter terminal coupled to ground. In one embodiment, the second transistor T2 acts as a switch. When the second control signal CS2 is generated at logic low level, the second transistor T2 is inactive and does not trigger the second relay 106b to control the load 108. Further, when the second control signal CS2 is generated at logic high level, the second transistor T2 is active and provides the second control signal CS2 to the second relay 106b to trigger the second relay 106b to control the load 108. In one embodiment, the second transistor T2 is an NPN transistor. It will be apparent to a person skilled in the art that although in the current embodiment, the second transistor T2 is an NPN transistor, in alternate embodiments, the second transistor T2 may be a PNP transistor, without deviating from the scope of the present disclosure. Examples of the second transistor T2 include, but are not limited to, a BJT, a FET, a MOSFET, and a JFET.

The second logic gate G2 has a first terminal coupled to the second relay 106b and configured to receive the second detection signal DS2, and a second terminal coupled to the collector terminal of the second transistor T2 and configured to receive the second control signal CS2. In one embodiment, the second logic gate G2 is an exclusive OR (XOR) gate. The second logic gate G2 further has an output terminal coupled with the second fault indicator L2 and the controller 102 and configured to generate the second fault signal FS2 based on the comparison of the second control signal CS2 and the second detection signal DS2. When both the second control signal CS2 and the second detection signal DS2 are at the same logic level, such as logic high level or logic low level, the second logic gate G2 generates the second fault signal FS2 at logic low level. Further, when the second control signal CS2 and the second detection signal DS2 are at different logic levels, such as one is at logic high level and other is at logic low level, the second logic gate G2 generates the second fault signal FS2 at logic high level. It will be apparent to a person skilled in the art that although in the current embodiment, the second logic gate G2 is an XOR gate, in alternate embodiments, the second logic gate G2 may be any suitable logic gate or a combination of multiple logic gates, without deviating from the scope of the present disclosure.

The second fault indicator L2 has a first terminal coupled to the output terminal of the second logic gate G2 and is configured to receive the second fault signal FS2 and a second terminal coupled to ground. In one embodiment, when the second fault signal FS2 is at logic low level, the second fault indicator L2 indicates that the second relay 106b is functional. Further, when the second fault signal FS2 is at logic high level, the second fault indicator L2 indicates that the second relay 106b is faulty. In the embodiment the second fault indicator L2 is a visual indicator such as an LED that is turned OFF when the second relay 106b is functional and the is turned ON when the second relay 106b is faulty. It will be apparent to a person skilled in the art that although in the current embodiment, the second fault indicator L2 is a visual indicator such as an LED, in alternate embodiments, the second fault indicator L2 may be any suitable indicator such as an audio indicator, a tactile indicator or a combination of multiple indicators, without deviating from the scope of the present disclosure.

The second relay 106b includes a second coil Co2 having a first terminal coupled to the power supply and configured to receive the supply voltage Vsupply, and a second terminal coupled to the collector terminal of the second transistor T2 to receive the second control signal CS2. The second relay 106b further includes third and fourth switches S3 and S4. The third switch S3 has a third contact C3, a first terminal coupled to the power supply and configured to receive the supply voltage Vsupply, and a second terminal coupled to the first terminal of the second logic gate G2 and configured to provide the second detection signal DS2 to the second logic gate G2. Thus, the power supply, the third switch S3, and the second logic gate G2 act as a third circuit such that the third switch S3 controls the third circuit. The fourth switch S4 has a fourth contact C4, and first and second terminals coupled to the load 108 and configured to control the load 108. Thus, the fourth switch S4 and the load 108 act as a fourth circuit such that the fourth switch S4 controls the fourth circuit. The fourth contact C4 is coupled with the third contact C3 by way of a non-conductive material such that the third and fourth switches S3 and S4 are mechanically linked and are in an open state and a closed state simultaneously.

In one scenario, when the second relay 106b is functional and when the second control signal CS2 is at logic high level, the second coil Co2 is energized and triggers the third and fourth switches S3 and S4 to activate (e.g., to be in the closed state), thereby completing the third and fourth circuits. The second detection signal DS2 is thus generated at logic high level. Further, when the second relay 106b is functional and when the second control signal CS2 is at logic low level, the second coil Co2 is deenergized and does not trigger the third and fourth switches S3 and S4, the third and fourth switches S3 and S4 thus being inactive (e.g., in the open state). The second detection signal DS2 is thus generated at logic low level.

In another scenario, when the second relay 106b is faulty and when the second control signal CS2 is at logic high level, the second coil Co2 is energized and triggers the third and fourth switches S3 and S4 to activate (e.g., to be in the closed state), however as the third and fourth switches S3 and S4 are stuck in the open state the third and fourth switches S3 and S4 remain inactive. The second detection signal DS2 is thus generated at logic low level. Further, when the second relay 106b is faulty and when the second control signal CS2 is at logic low level, the second coil Co2 is deenergized and does not trigger the third and fourth switches S3 and S4, however as the third and fourth switches S3 and S4 are stuck at shut closed state, the third and fourth switches S3 and S4 thus being active (e.g., in the closed state). The second detection signal DS2 is thus generated at logic high level.

The second relay 106b thus controls the load 108 when the second control signal CS2 is at logic high level and the second relay 106b is functional. When the second relay 106b is faulty, the fault detector 104 generates the second fault signal FS2 at logic high level to indicate that the second relay 106b is faulty and provides the second fault signal FS2 to the controller 102. The controller 102 receives the second fault signal FS2. If the second fault signal FS2 indicates to the controller 102 that the second relay 106b is functional, the controller 102 continues generating the second control signal CS2 at logic high level such that the second relay 106b controls the load 108. If the second fault signal FS2 indicates to the controller 102 that the second relay 106b is faulty, the controller 102 is configured to generate an alert indicating that both the first relay 106a and the second relay 106b are faulty and generates the first control signal CS1 at logic low level and the second control signal CS2 at logic low level.

In one embodiment, the first relay 106a and the first fault detection circuit 202a together act as a first fault detection relay. Similarly, the second relay 106b and the second fault detection circuit 202b together act as a second fault detection relay. It will be apparent to a person skilled in the art that although in the current embodiment, the apparatus 100 has two relays, the scope of the present disclosure is not limited to it. In various other embodiments, the controller 102 may include any number of relays and when a relay that is controlling the load 108 is determined to be faulty the controller 102 may switch the control to another functional relay, without deviating from the scope of the present disclosure.

Figure 3:
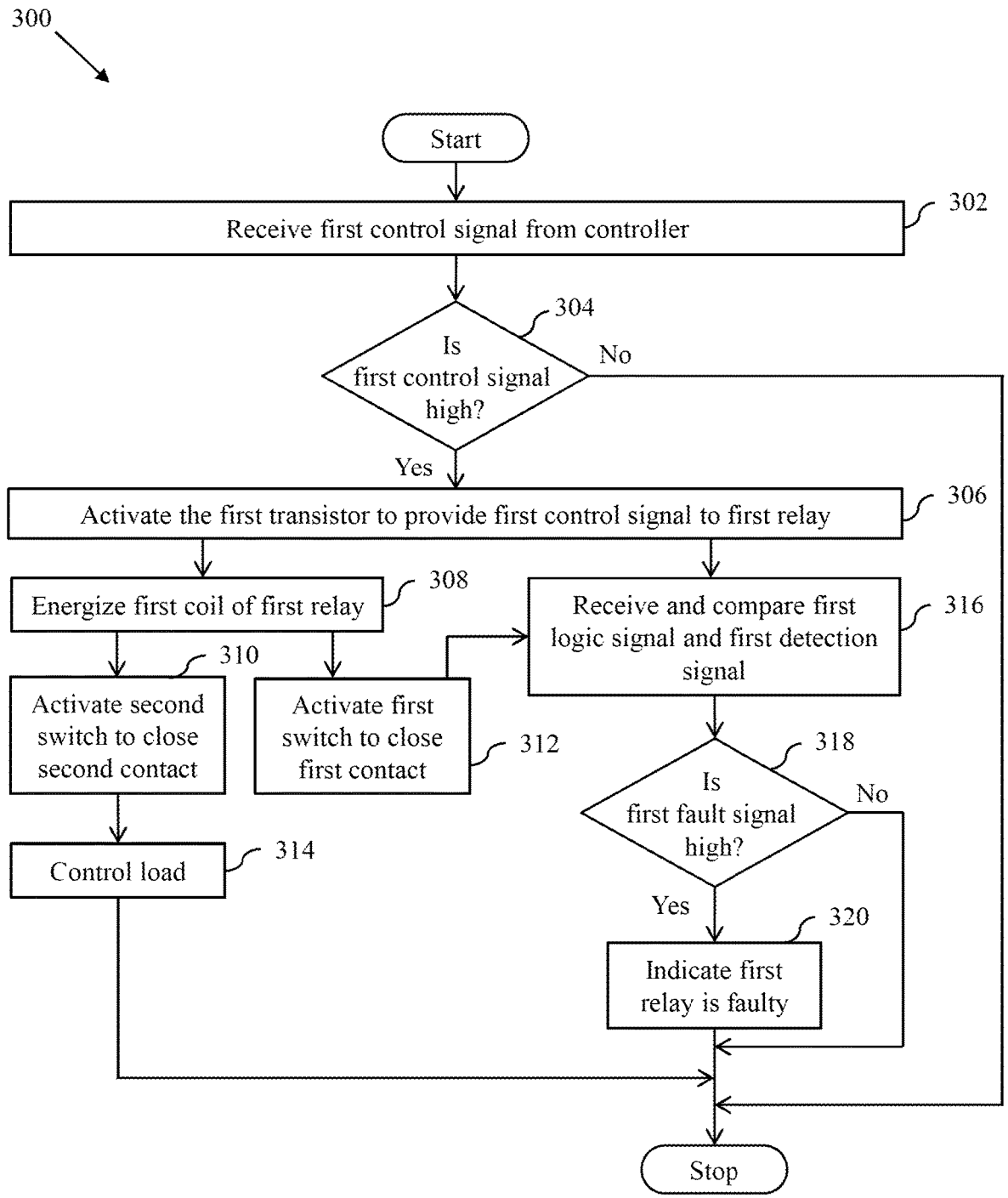
FIG. 3 is a flow chart illustrating an operation of a first fault detection circuit and a first relay of the apparatus of FIG. 2, in accordance with an embodiment of the present disclosure.

FIG. 3 is a flow chart 300 illustrating an operation of the first fault detection circuit 202a and the first relay 106a, in accordance with an embodiment of the present disclosure. At 302, the first transistor T1 receives the first control signal CS1 from the controller 102.

At 304, determine whether the first control signal CS1 is at logic high state. If at 304, the first control signal CS1 is at logic high state, 306 is executed. At 306, the first transistor T1 is activated to provide the first control signal CS1 to the first relay 106a. The first transistor T1 further provides the first control signal CS1 to the first logic gate G1.

At 308, the first coil Co1 of the first relay 106a is energized. After 308, 310 and 312 are executed. At 310, the second switch S2 is activated to close the second contact C2. At 314, the first relay 106a controls the load 108. At 312, the first switch S1 is activated to close the first contact C1 and thus generate the first detection signal DS1 at logic high state. After 306 and 312, 316 is executed.

At 316, the first logic gate G1 receives the first control signal CS1 from the first transistor T1 and the first detection signal DS1 from the first relay 106a and compares the first control signal CS1 and the first detection signal DS1 to generate the first fault signal FS1. At 318, determine whether the first fault signal FS1 is at logic high state. If at 318, the first fault signal FS1 is at logic high state, 320 is executed. At 320, the first fault indicator L1 indicates that the first relay 106a is faulty.

Figure 4A:
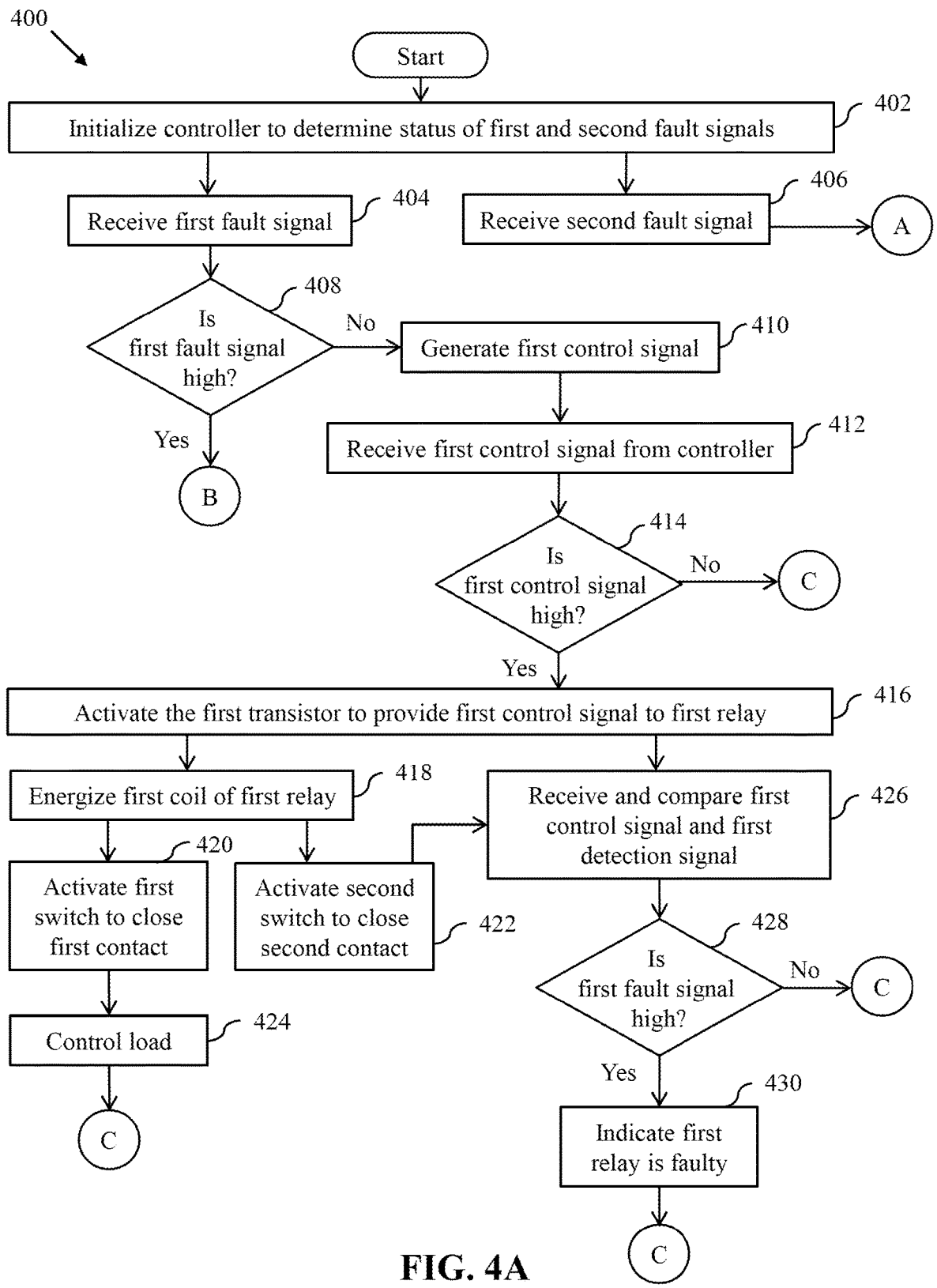
FIGS. 4A and 4B, collectively, represent a flow chart illustrating an operation of the apparatus of FIG. 2, in accordance with an embodiment of the present disclosure.
Figure 4B:
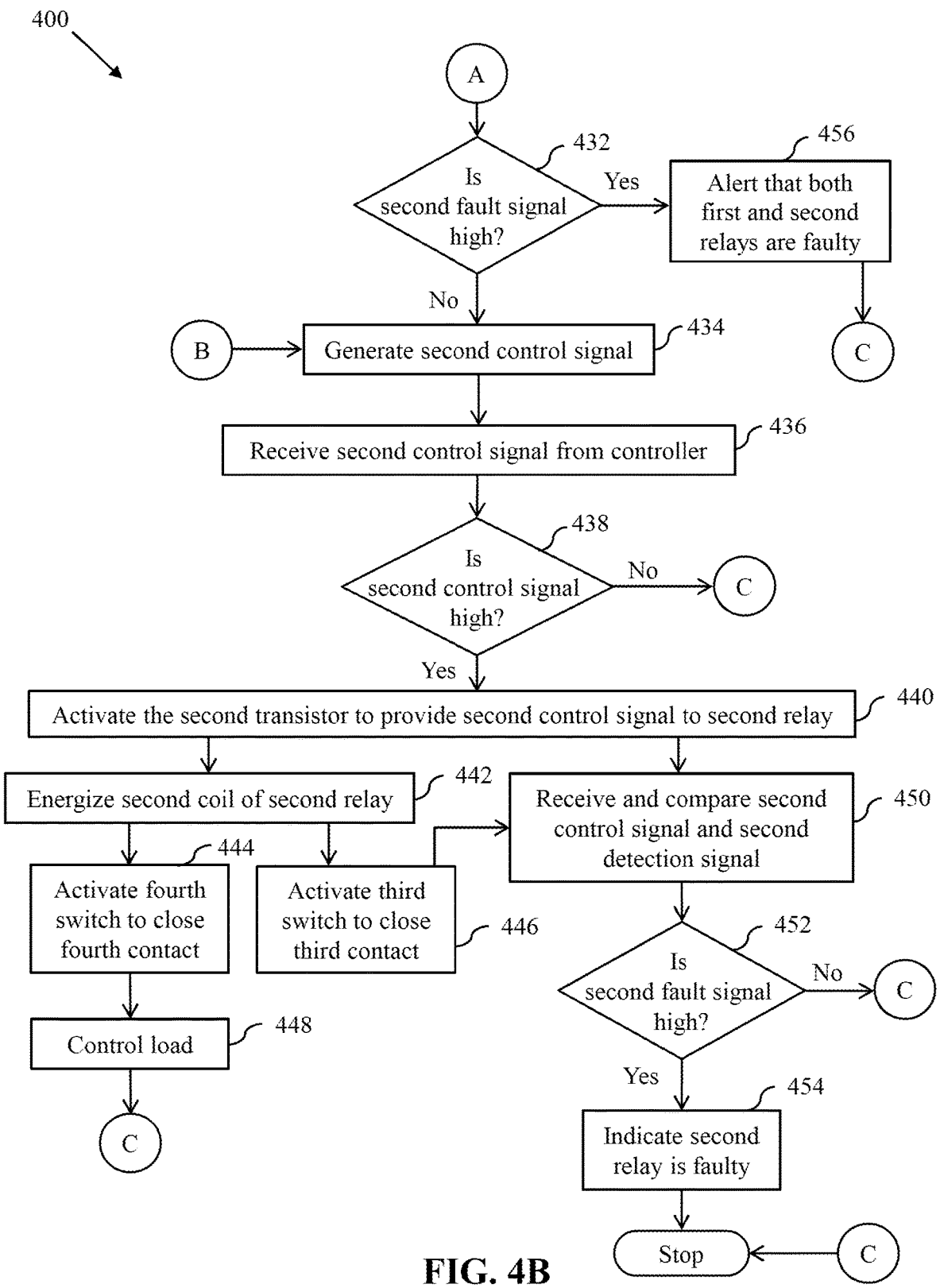

FIGS. 4A and 4B, collectively, represent a flow chart 400 illustrating an operation of the apparatus 100, e.g., a method for fault detection and automated redundancy in relays, in accordance with an embodiment of the present disclosure. At 402, the controller 102 is initialized to determine the status of the first and second fault signals FS1 and FS2. After 402, 404 and 406 are performed. At 404, the first fault signal FS1 is received by the controller 102 from the fault detector 104. At 406, the second fault signal FS2 is received by the controller 102 from the fault detector 104. After 404, 408 is executed.

At 408, determine whether the first fault signal FS1 is at logic high level. If at 408, the first fault signal FS1 is not at logic high level (e.g., is at logic low level), 410 is executed. At 410, the controller 102 generates the first control signal CS1 to trigger the first relay 106a to control the load 108. At 412, the first transistor T1 receives the first control signal CS1 from the controller 102.

At 414, determine whether the first control signal CS1 is at logic high state. If at 304, the first control signal CS1 is at logic high state, 416 is executed. At 416, the first transistor T1 is activated to provide the first control signal CS1 to the first relay 106a. The first transistor T1 further provides the first control signal CS1 to the first logic gate G1.

At 418, the first coil Co1 of the first relay 106a is energized. After 418, 420 and 422 are executed. At 420, the second switch S2 is activated to close the second contact C2. At 424, the first relay 106a controls the load 108. At 422, the first switch S1 is activated to close the first contact C1 and thus generate the first detection signal DS1 at logic high state. After 416 and 422, 426 is executed.

At 426, the first logic gate G1 receives the first control signal CS1 from the first transistor T1 and the first detection signal DS1 from the first relay 106a and compares the first control signal CS1 and the first detection signal DS1 to generate the first fault signal FS1. At 428, determine whether the first fault signal FS1 is at logic high state. If at 428, the first fault signal FS1 is at logic high state, 430 is executed. At 430, the first fault indicator L1 indicates that the first relay 106a is faulty. Further, the fault detector 104 provides the first fault signal FS1 to the controller 102.

If at 408, the first fault signal FS1 is at logic high level, 432 is executed. After 406, 432 is executed. At 432, determine whether the second fault signal FS2 is at logic high level. If at 432, the second fault signal FS2 is not at logic high level (e.g., is at logic low level), 434 is executed.

At 434, the controller 102 generates the second control signal CS2 to trigger the second relay 106b to control the load 108, thereby automatically switching the control of the load 108 from a faulty relay, such as the relay 106a, to a functional relay, such as the relay 106b. At 436, the second transistor T2 receives the second control signal CS2 from the controller 102.

At 438, determine whether the second control signal CS2 is at logic high state. If at 438, the second control signal CS2 is at logic high state, 440 is executed. At 440, the second transistor T2 is activated to provide the second control signal CS2 to the second relay 106b. The second transistor T2 further provides the second control signal CS2 to the second logic gate G2.

At 442, the second coil Co2 of the second relay 106b is energized. After 442, 444 and 446 are executed. At 444, the fourth switch S4 is activated to close the fourth contact C4. At 448, the second relay 106b controls the load 108. At 446, the third switch S3 is activated to close the third contact C3 and thus generate the second detection signal DS2 at logic high state. After 440 and 446, 450 is executed.

At 450, the second logic gate G2 receives the second control signal CS2 from the second transistor T2 and the second detection signal DS2 from the second relay 106b and compares the second control signal CS2 and the second detection signal DS2 to generate the second fault signal FS2. At 452, determine whether the second fault signal FS2 is at logic high state. If at 452, the second fault signal FS2 is at logic high state, 454 is executed. At 454, the second fault indicator L2 indicates that the second relay 106b is faulty. Further, the fault detector 104 provides the second fault signal FS2 to the controller 102. If at 432, the second fault signal FS2 is at logic high level, 456 is executed. At 456, the controller 102 alerts that both the first and second relays 106a and 106b are faulty. Thus, when a relay, such as the first relay 106a, is faulty, the apparatus 100 automatically switches from the faulty relay to a functional relay, such as the second relay 106b.

Figure 5:
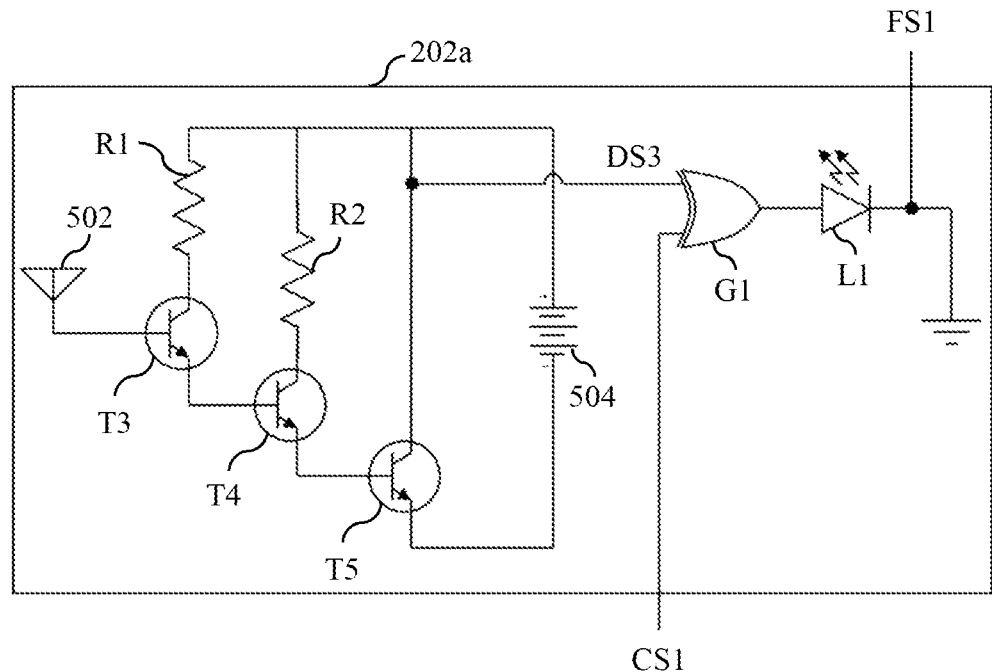
FIG. 5 is a circuit diagram of a first fault detection circuit of the apparatus of FIG. 2, in accordance with another embodiment of the present disclosure.

FIG. 5 is a circuit diagram of the first fault detection circuit 202a of the apparatus 100, in accordance with another embodiment of the present disclosure. In this embodiment, the first fault detection circuit 202a includes an antenna 502, third through fifth transistors T3-T5, first and second resistors R1 and R2, a battery 504, the first logic gate G1, and the first fault indicator L1. In this embodiment, the first relay 106a includes the first coil Co1 and the second switch S2.

The antenna 502 is positioned near a circuit connection from the second switch S2 to the load 108. The antenna 502 is configured to detect one of: a presence and an absence of electricity flowing through the load 108 and generate a third detection signal DS3. In one embodiment, when the first control signal CS1 is at logic high level and the first relay 106a is controlling the load 108, the electricity flows through the load 108. Further, when the first control signal CS1 is at logic low level and the first relay 106a is not controlling the load 108, the electricity does not flow through the load 108. In one embodiment, the presence or absence of electricity is detected by detecting an electromagnetic field generated due to AC voltage flowing through the second circuit.

The third transistor T3 has a base terminal coupled with the antenna 502 and configured to receive the third detection signal DS3, a collector terminal coupled to the first resistor R1, and an emitter terminal coupled to the fourth transistor T4. The first resistor R1 has a first terminal coupled to the collector terminal of the third transistor T3 and a second terminal coupled to the second resistor R2, the fifth transistor T5, the battery 504, and the first logic gate G1. In one example, the first resistor R1 has a resistance of 1 mega ohm.

The fourth transistor T4 has a base terminal coupled with the emitter terminal of the third transistor T3, a collector terminal coupled to the second resistor R2, and an emitter terminal coupled to the fifth transistor T5. The second resistor R2 has a first terminal coupled to the collector terminal of the fourth transistor T4 and a second terminal coupled to the first resistor R1, the fifth transistor T5, the battery 504, and the first logic gate G1. In one example, the second resistor R2 has a resistance of 100 kilo ohms.

The fifth transistor T5 has a base terminal coupled with the emitter terminal of the fourth transistor T4, a collector terminal coupled to the first resistor R1, the second resistor R2, the battery 504, and the first logic gate G1, and an emitter terminal coupled to the battery 504. The battery 504 has a positive terminal coupled to the second terminal of the first resistor R1, the second terminal of the second resistor R2, the collector terminal of the fifth transistor T5, and the first logic gate G1. The battery 504 further has a negative terminal coupled to the emitter terminal of the fifth transistor T5. In one embodiment, the third through fifth transistors T3-T5 are NPN transistors. It will be apparent to a person skilled in the art that although in the current embodiment, the third through fifth transistors T3-T5 are NPN transistors, in alternate embodiments, the third through fifth transistors T3-T5 may be PNP transistors, without deviating from the scope of the present disclosure. Examples of the third through fifth transistors T3-T5 include, but are not limited to, a BJT, a FET, a MOSFET, and a JFET.

The third through fifth transistors T3-T5, the first and second resistors R1 and R2, and the battery 504 operate in a manner that when the antenna 502 detects the absence of electricity flowing through the load 108, the third detection signal DS3 is generated at logic low level, and when the antenna 502 detects the presence of electricity flowing through the load 108, the third detection signal DS3 is generated at logic high level.

The first logic gate G1 has the first input terminal coupled to the first and second resistors R1 and R2, the collector terminal of the fifth transistor T3, and the positive terminal of the battery 504, and is configured to receive the third detection signal DS3. The first logic gate G1 further has the second input terminal coupled to the controller 102 and configured to receive the first control signal CS1. The third detection signal DS3 and the first control signal CS1 are compared by the first logic gate G1 similar to the comparison of the first detection signal DS1 and the first control signal CS1 as described in FIG. 2. The first logic gate G1 further has the output terminal configured to generate and output the first fault signal FS1.

The first fault indicator L1 is structurally and functionally similar as described in FIG. 2. When the first control signal CS1 is at logic high level and the antenna 502 detects the presence of electricity and when the first control signal CS1 is logic low level and the antenna 502 detects the absence of electricity, the first fault signal FS1 is generated at logic low level indicating that the first relay 106a is functional. Further, when the first control signal CS1 is at logic low level and the antenna 502 detects the presence of electricity and when the first control signal CS1 is at logic high level and the antenna 502 detects the absence of electricity, the first fault signal FS1 is generated at logic high level indicating that the first relay 106a is faulty.

It will be understood by a person skilled in the art that in this embodiment, the second fault detection circuit 202b is structurally and functionally similar to the first fault detection circuit 202a as described above, and the second fault signal FS2 is generated in a similar manner as the first fault signal FS1 to indicated that the second relay 106b is one of functional and faulty.

Figure 6:
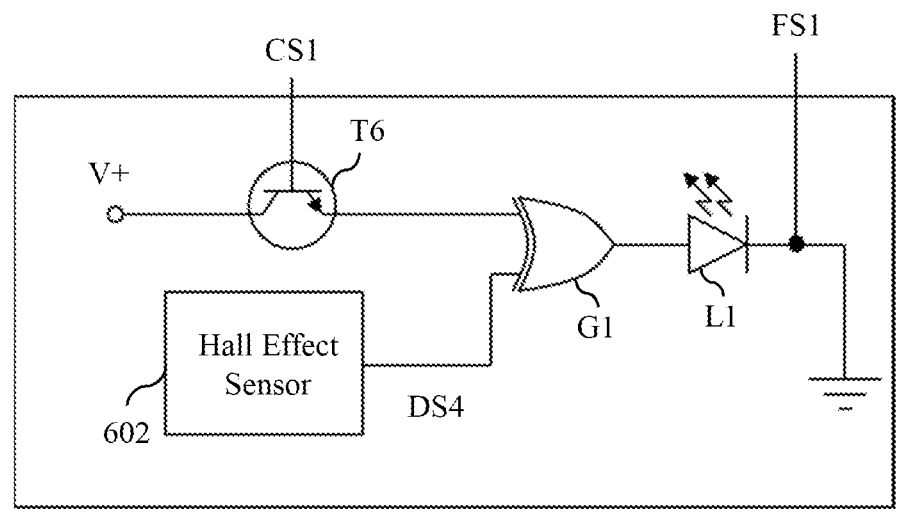
FIG. 6 is a circuit diagram of a first fault detection circuit of the apparatus of FIG. 2, in accordance with yet another embodiment of the present disclosure.

FIG. 6 is a circuit diagram of the first fault detection circuit 202a of the apparatus 100, in accordance with yet another embodiment of the present disclosure. In this embodiment, the first fault detection circuit 202a includes a hall effect sensor 602, a sixth transistor T6, the first logic gate G1, and the first fault indicator L1. In this embodiment, the first relay 106a includes the first coil Co1 and the second switch S2.

The hall effect sensor 602 is positioned near a circuit connection from the second switch S2 to the load 108. The hall effect sensor 602 is configured to detect one of: a presence and an absence of electricity flowing through the load 108 and generate a fourth detection signal DS4. In one embodiment, when the first control signal CS1 is at logic high level and the first relay 106a is controlling the load 108, the electricity flows through the load 108. Further, when the first control signal CS1 is at logic low level and the first relay 106a is not controlling the load 108, the electricity does not flow through the load 108. In one embodiment, the presence or absence of electricity is detected by detecting an electromagnetic field generated due to AC voltage flowing through the second circuit.

The sixth transistor T6 has a base terminal coupled to the controller 102 and configured to receive the first control signal CS1, a collector terminal coupled to the power supply and configured to receive a positive voltage V+, and an emitter terminal coupled to the first terminal of the first logic gate G1. In one embodiment, the sixth transistor T6 is an NPN transistor. It will be apparent to a person skilled in the art that although in the current embodiment, the sixth transistor T6 is an NPN transistor, in alternate embodiments, the sixth transistor T6 may be a PNP transistor, without deviating from the scope of the present disclosure. Examples of the sixth transistor T6 include, but are not limited to, a BJT, a FET, a MOSFET, and a JFET.

When the hall effect sensor 602 detects the absence of electricity flowing through the load 108, the fourth detection signal DS4 is generated at logic low level, and when the hall effect sensor 602 detects the presence of electricity flowing through the load 108, the fourth detection signal DS4 is generated at logic high level.

The first logic gate G1 has the first input terminal coupled to the emitter terminal of the sixth transistor T6 and is configured to receive the first control signal CS1. The first logic gate G1 further has the second input terminal coupled to the hall effect sensor 602 and configured to receive the fourth detection signal DS4. The fourth detection signal DS4 and the first control signal CS1 are compared by the first logic gate G1 similar to the comparison of the first detection signal DS1 and the first control signal CS1 as described in FIG. 2. The first logic gate G1 further has the output terminal configured to generate and output the first fault signal FS1.

The first fault indicator L1 is structurally and functionally similar as described in FIG. 2. When the first control signal CS1 is at logic high level and the hall effect sensor 602 detects the presence of electricity and when the first control signal CS1 is logic low level and the hall effect sensor 602 detects the absence of electricity, the first fault signal FS1 is generated at logic low level indicating that the first relay 106a is functional. Further, when the first control signal CS1 is at logic low level and the hall effect sensor 602 detects the presence of electricity and when the first control signal CS1 is at logic high level and the hall effect sensor 602 detects the absence of electricity, the first fault signal FS1 is generated at logic high level indicating that the first relay 106a is faulty.

It will be understood by a person skilled in the art that in this embodiment, the second fault detection circuit 202b is structurally and functionally similar to the first fault detection circuit 202a as described above, and the second fault signal FS2 is generated in a similar manner as the first fault signal FS1 to indicated that the second relay 106b is one of functional and faulty.

In one embodiment, the first fault detection circuit 202a may be a fault detector built into a relay, such as the first relay 106a, or a pass through device for verifying continuity in AC circuitry.

For automatically switching from a faulty relay to a functional relay there are two approaches: one includes a microcontroller (shown later in FIG. 9 and FIG. 10) and the other includes a circuit (shown later in FIG. 7) including individual circuit components. In the first approach, a digital pin of the microcontroller is set as input pin and coupled to the controller 102 to receive an output (e.g., at least one of the control signals) of the controller 102. In one example, the microcontroller is a programmable logic circuit or any other type of microcontroller. Upon receiving at least one of the control signals, the microcontroller provides an output signal to the relay (e.g., the first relay 106a) being controlled. The input from the controller 102 is compared to the input from either the antenna 502 or the hall effect sensor 602 to determine whether the relay is functional or faulty. In one example, the comparison is done based on a program included in the microcontroller. If the two inputs do not match, the relay is faulty and the at least one control signal is directed to a different relay (e.g., the second relay 106b).

Figure 7:
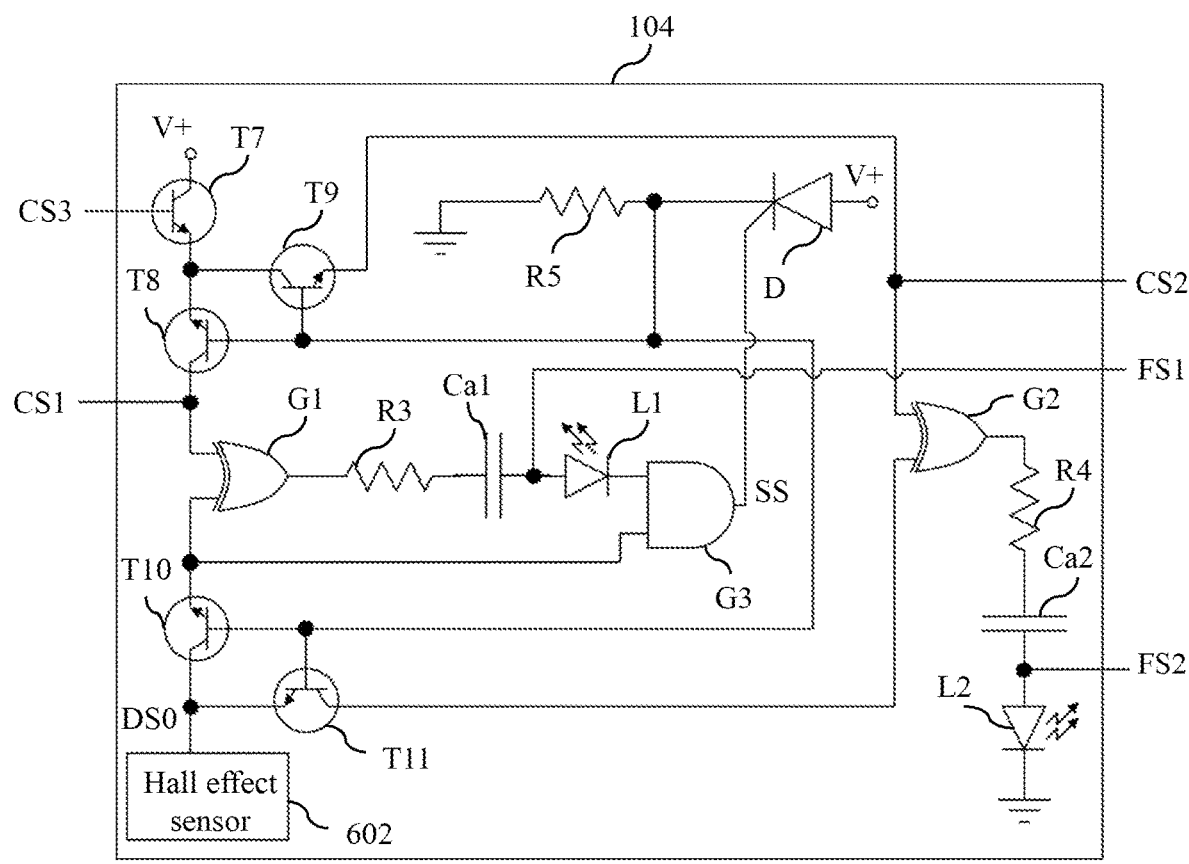
FIG. 7 is a circuit diagram of a fault detector of the apparatus of FIG. 1, in accordance with another embodiment of the present disclosure.

FIG. 7 is a circuit diagram of the fault detector 104 of the apparatus 100, in accordance with another embodiment of the present disclosure. In this embodiment, the hall effect sensor 602 is positioned next to a conductor connecting two terminals of a relay, such as the relay 106a, that are coupled to two terminals of the load 108, such as IN-Load and OUT-Load terminals inside the apparatus 100. The fault detector 104 includes the hall effect sensor 602, seventh through eleventh transistors T7-T11, third through fifth resistors R3-R5, first and second capacitors Ca1 and Ca2, the first and second logic gates G1 and G2, a third logic gate G3, the first and second fault indicators L1 and L2, and a diode D1.

The seventh transistor T7 has a base terminal coupled to the controller 102 and configured to receive a third control signal C3, a collector terminal coupled to the power supply and configured to receive the positive voltage V+, and an emitter terminal coupled to the eighth transistor T8 and the ninth transistor T9. The eighth transistor T8 has a base terminal coupled to the ninth transistor T9 and the tenth transistor T10, a collector terminal coupled to the first relay 106a and the first logic gate G1 and configured to provide the first control signal CS1, and an emitter terminal coupled to the ninth transistor T9 and the emitter terminal of the eighth transistor T7. The ninth transistor T9 has a base terminal coupled to the tenth transistor T10 and the base terminal of the eight transistor T9, a collector terminal coupled to the emitter terminal of the seventh and eighth transistors T7 and T8, and an emitter terminal coupled to the second relay 106b and the second logic gate G2 and configured to provide the second control signal CS2.

The first logic gate G1 has the first input terminal coupled to the collector terminal of the eighth transistor T8 to receive the first control signal CS1 and a second terminal coupled to the tenth transistor T10 to receive a detection signal DS0. The first logic gate G1 further has the output terminal coupled to the third resistor R3 to provide the first fault signal FS1. The first fault indicator L1 receives the first fault signal FS1 from the first logic gate G1 by way of the third resistor R3 and the first capacitor Ca1. The first fault indicator L1 is coupled to a third logic gate to provide the first fault signal FS1.

The tenth transistor T10 has a base terminal coupled to the eleventh transistor T11 and the base terminals of the eighth and ninth transistors T8 and T9, a collector terminal coupled to the hall effect sensor 602 to receive the detection signal DS0, and an emitter terminal coupled to the third logic gate G3 and the second terminal of the first logic gate G1 to provide the detection signal DS0. The eleventh transistor T11 has a base terminal coupled to the base terminals of the eighth, ninth, and tenth transistors T8, T9, and T10, an emitter terminal coupled to the hall effect sensor 602 to receive the detection signal DS0, and a collector terminal coupled to the second input terminal of the second logic gate G2 to provide the detection signal DS0. Thus, the first logic gate G1 generates the first fault signal FS1 based on the comparison of the first control signal CS1 and the detection signal DS0 and the second logic gate G2 generates the second fault signal FS2 based on the comparison of the second control signal CS2 and the detection signal DS0. In one embodiment, the seventh through eleventh transistors T7-T11 are NPN transistors. It will be apparent to a person skilled in the art that although in the current embodiment, the seventh through eleventh transistors T7-T11 are NPN transistors, in alternate embodiments, the seventh through eleventh transistors T7-T11 may be PNP transistors, without deviating from the scope of the present disclosure. Examples of the seventh through eleventh transistors T7-T11 include, but are not limited to, a BJT, a FET, a MOSFET, and a JFET.

The third logic gate G3 has a first input terminal coupled to the emitter terminal of the tenth logic gate T10 to receive the detection signal DS0 and a second input terminal coupled to the first fault indicator L1 to receive the first fault signal FS1. The third logic gate G3 further has an output terminal coupled to the diode D and configured to generate and provide a switching signal SS. In one embodiment, the third logic gate G3 is an AND gate. When the first fault signal FS1 is at logic high level and the detection signal DS0 is at logic high level, that is when the first relay 106a is faulty and the first relay 106a is controlling the load 108, the third logic gate G3 generates the switching signal at logic high level to switch the controlling of the load 108 from the first relay 106a to the second relay 106b.

In one embodiment, the diode D is a silicon controlled rectifier (SCR) diode. The diode D has an anode terminal coupled to the power supply to receive the positive voltage V+, a gate terminal coupled to the output terminal of the third logic gate G3 to receive the switching signal SS, and a cathode terminal coupled to base terminals of the eighth through eleventh transistors T8-T11 and ground by way of the fifth resistor R5.

The second logic gate G2 has the first input terminal coupled to the emitter terminal of the ninth transistor T9 to receive the second control signal CS2 and the second terminal coupled to the collector terminal of the eleventh transistor T11 to receive the detection signal DS0. The second logic gate G2 further has the output terminal coupled to the fourth resistor R4 to provide the second fault signal FS2. The second fault indicator L2 receives the second fault signal FS2 from the second logic gate G2 by way of the fourth resistor R4 and the second capacitor Ca2. The second fault indicator L2 is coupled to the second logic gate G2 and ground.

The fault detector 104 thus detects whether the first and second relays 106a and 106b are one of functional and faulty and automatically switches from faulty relay to functional relay. In one embodiment, the fault detector 104 may be incorporated into a relay or packaged in an individual unit to be utilized as a pass-through device for integration into currently existing systems.

Figure 8:
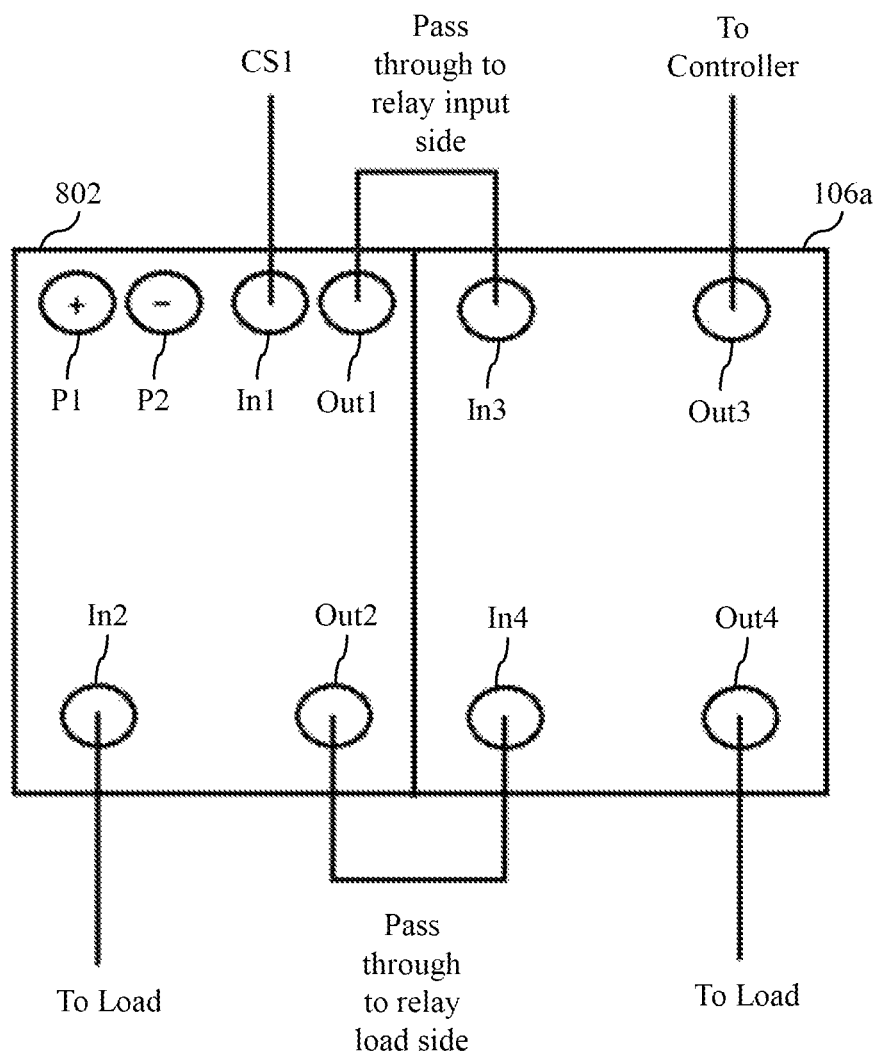
FIG. 8 is a block diagram of the first relay of FIG. 1 with a pass through fault detector, in accordance with an embodiment of the present disclosure.

FIG. 8 is a block diagram of the first relay 106a with a pass through fault detector 802, in accordance with an embodiment of the present disclosure. The pass through fault detector 802 includes first and second power terminals P1 and P2, first and second input terminal In1 and In2, and first and second output terminals Out1 and Out2. The first relay 106a includes first and second input terminals In3 and In4 and first and second output terminals Out1 and Out2. The first power terminal P1 is coupled to the power supply to receive positive supply voltage and the second power terminal P2 is coupled to the power supply to receive negative supply voltage. The first input terminal In1 is coupled to the controller 102 to receive the first control signal CS1 and the first output terminal Out1 of the pass through fault detector 802 is coupled to the first input terminal In3 of the first relay 106a to pass through the first control signal CS1 to relay input side. The first output terminal Out3 is coupled to the controller 102. The second input terminal In2 is coupled to the load 108 and the second output terminal Out2 of the pass through fault detector 802 is coupled to the second input terminal In4 of the first relay 106a to pass through the control of the load 108 to relay load side. The first output terminal Out4 is coupled to the load 108.

In one embodiment, the pass through fault detector 802 indicates that the relay 106a is functional or faulty by way of a fault indicator similar to the first fault indicator L1 or a signal wire coupled to the controller 102.

Figure 9:
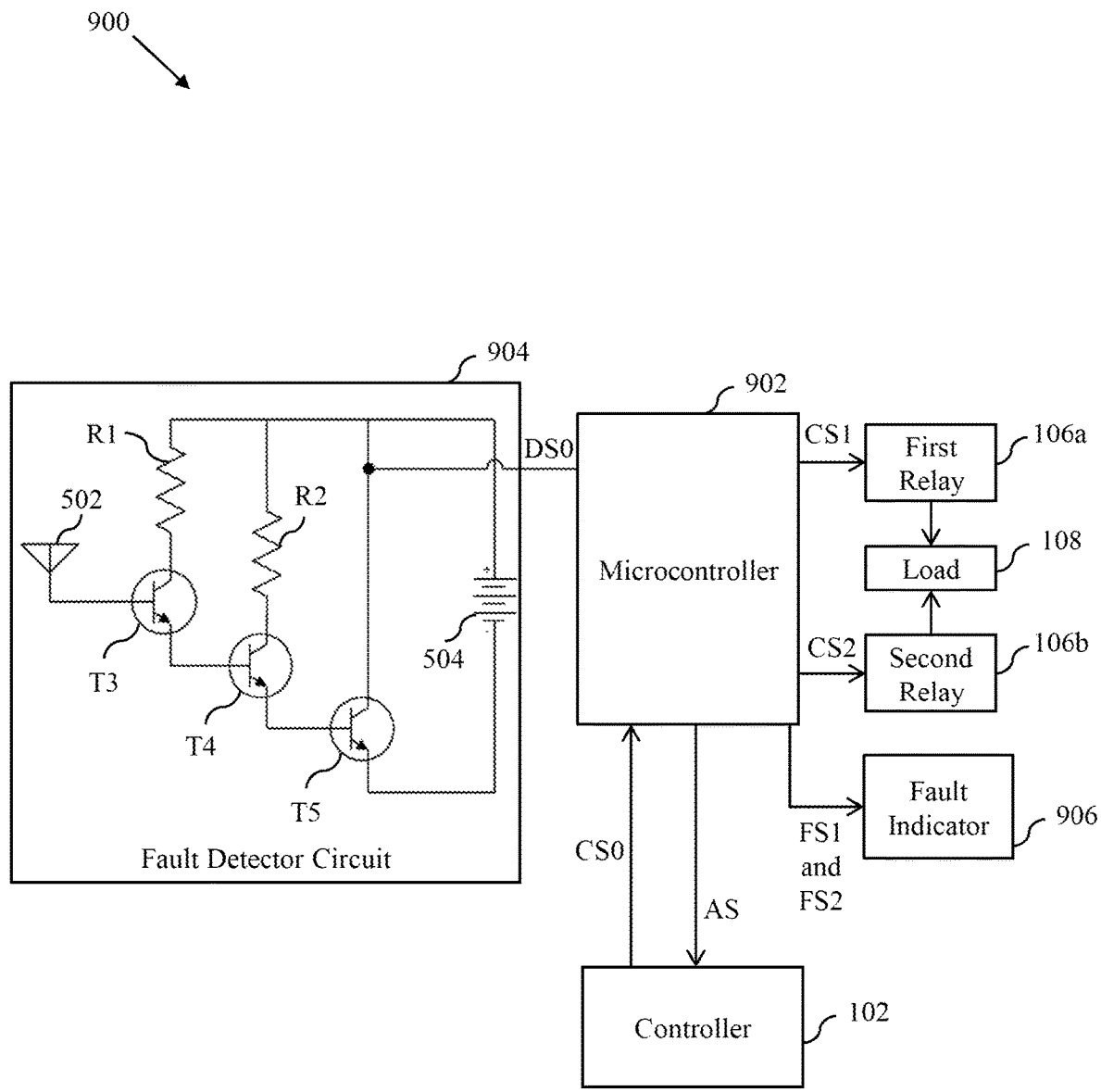
FIG. 9 is a block diagram of an apparatus for detecting faults in relays and switching between relays, in accordance with another embodiment of the present disclosure.

FIG. 9 is a block diagram of an apparatus 900 for detecting faults in relays and switching between relays, in accordance with another embodiment of the present disclosure. The apparatus 900 includes the controller 102, a microcontroller 902, the first and second relays 106a and 106b, the load 108, a fault detector circuit 904, and a fault indicator 906.

The controller 102 is configured to generate a control signal CS0 to trigger one of the first and second relays 106a and 106b to control the load 108. The microcontroller 902 is coupled to the controller 102, and is configured to receive the control signal CS0 as an input and generate, based on the control signal CS0, the first control signal CS1 to trigger the first relay 106a to control the load 108 and the second control signal CS2 to trigger the second relay 106b to control the load 108.

The fault detector 904 is coupled to the microcontroller 902, and configured to detect one of the presence and the absence of electricity flowing through the load 108 to generate the detection signal DS0 and provide the detection signal DS0 as an input to the microcontroller 902. The fault detector 904 includes the antenna 502, the third through fifth transistors T3-T5, the first and second resistors R1 and R2, and the battery 504, that function in a similar manner as described in FIG. 5. The third through fifth transistors T3-T5, the first and second resistors R1 and R2, and the battery 504 operate in a manner that when the antenna 502 detects the absence of electricity flowing through the load 108, the detection signal DS0 is generated at logic low level, and when the antenna 502 detects the presence of electricity flowing through the load 108, the detection signal DS0 is generated at logic high level.

The microcontroller 902 determines whether the first and second relays 106a and 106b are one of functional and faulty based on the detection signal DS0 and the first and second control signals CS1 and CS2. Based on the determination, the microcontroller 902 generates the first and second signals CS1 and CS2 to trigger one of the first and second relays 106a and 106b to control the load 108 such that the relay which is functional is triggered to control the load 108. When the first control signal CS1 triggers the first relay 106a to control the load 108 and the detection signal DS0 is at logic low state, the microcontroller 902 determines that the first relay 106a is faulty. Similarly, when the second control signal CS2 triggers the second relay 106b to control the load 108 and the detection signal DS0 is at logic low state, the microcontroller 902 determines that the second relay 106b is faulty. Based on determination whether the first and second relays 106a and 106b are one of functional and faulty, the microcontroller 902 generates the first and second fault signals FS1 and FS2.

The microcontroller 902 is further configured to automatically switch the control of the load 108 from a faulty relay, such as the first relay 106a, to a functional relay, such as the second relay 106b, when the microcontroller 902 determines the first relay 106a is faulty.

The fault indicator 906 is coupled to the microcontroller 902, and is configured to receive the first and second fault signals FS1 and FS2 and indicate whether at least one of the first and second relays 106a and 106b is one of functional and faulty. In one embodiment, the fault indicator 906 includes the first and second fault indicators L1 and L2 to indicate whether the first and second relays 106a and 106b are functional or faulty in a similar manner as described in FIG. 2. In one example, the first and second fault indicators L1 and L2 are LEDs.

The microcontroller 902 is further configured to generate and provide to the controller 102 an alert signal AS based on the first and second fault signals FS1 and FS2 to indicate the status of the first and second relays 106a and 106b. In one embodiment, the microcontroller 102 may directly provide the first and second fault signals FS1 and FS2 instead of the alert signal AS to indicate that the first and second relays 106a and 106b are functional or fault, without deviating from the scope of the present disclosure.

There are multiple configurations for the wiring that connect the load 108 to both the primary (or first 106a) and redundant (or second 106b) relay. One example for wiring the load 108 to the relays 106 would be placing the load wires in parallel with both the main and redundant relays' load terminals. With this configuration, should a failure cause the main relay to be in an open state, no further components would be required for the redundant relay to control the load 108. However, should the main relay fail in a closed state, a switch of some sort be it mechanical, electromechanical, solid state, etc. would be included in the circuit to break the path to the main relay. Through breaking the path of flow for the load 108 through the main relay, the redundant relay could take its place.

Figure 10:
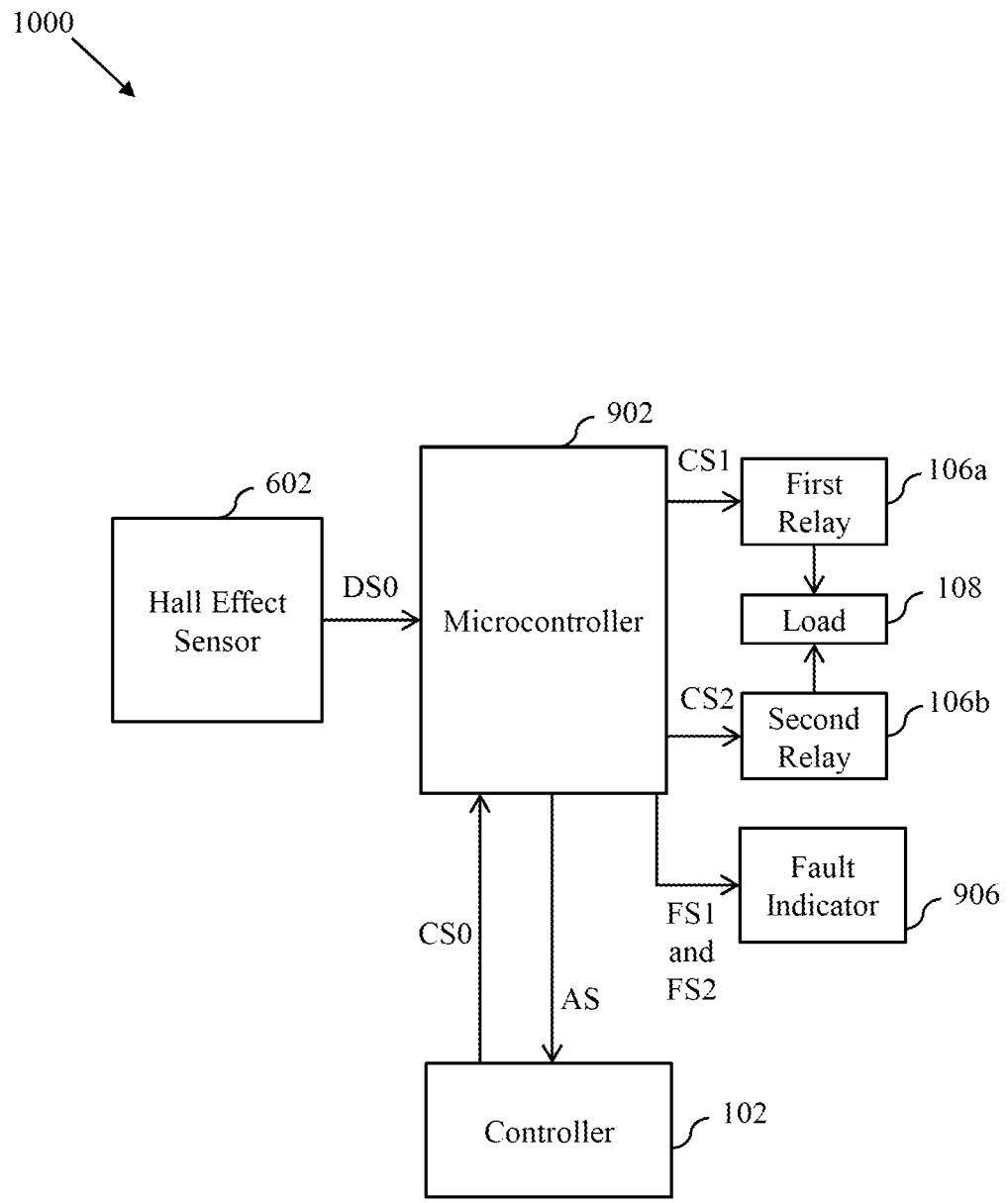
FIG. 10 is a block diagram of an apparatus for detecting faults in relays and switching between relays, in accordance with yet another embodiment of the present disclosure.

FIG. 10 is a block diagram of an apparatus 1000 for detecting faults in relays and switching between relays, in accordance with yet another embodiment of the present disclosure. The apparatus 1000 includes the controller 102, the microcontroller 902, the first and second relays 106a and 106b, the load 108, the hall effect sensor 602, and the fault indicator 906.

The controller 102 is configured to generate the control signal CS0 to trigger one of the first and second relays 106a and 106b to control the load 108. The microcontroller 902 is coupled to the controller 102, and is configured to receive the control signal CS0 as an input and generate, based on the control signal CS0, the first control signal CS1 to trigger the first relay 106a to control the load 108 and the second control signal CS2 to trigger the second relay 106b to control the load 108.

The hall effect sensor 602 is coupled to the microcontroller 902, and configured to detect one of the presence and the absence of electricity flowing through the load 108 to generate a detection signal DS0 and provide the detection signal DS0 as an input to the microcontroller 902. When the hall effect sensor 602 detects the absence of electricity flowing through the load 108, the detection signal DS0 is generated at logic low level, and when the hall effect sensor 602 detects the presence of electricity flowing through the load 108, the detection signal DS0 is generated at logic high level.

The microcontroller 902 determines whether the first and second relays 106a and 106b are one of functional and faulty based on the detection signal DS0 and the first and second control signals CS1 and CS2. Based on the determination, the microcontroller 902 generates the first and second signals CS1 and CS2 to trigger one of the first and second relays 106a and 106b to control the load 108 such that the relay which is functional is triggered to control the load 108. When the first control signal CS1 triggers the first relay 106a to control the load 108 and the detection signal DS0 is at logic low state, the microcontroller 902 determines that the first relay 106a is faulty. Similarly, when the second control signal CS2 triggers the second relay 106b to control the load 108 and the detection signal DS0 is at logic low state, the microcontroller 902 determines that the second relay 106b is faulty. Based on determination whether the first and second relays 106a and 106b are one of functional and faulty, the microcontroller 902 generates the first and second fault signals FS1 and FS2.

The microcontroller 902 is further configured to automatically switch the control of the load 108 from a faulty relay, such as the first relay 106a, to a functional relay, such as the second relay 106b, when the microcontroller 902 determines the first relay 106a is faulty.

The fault indicator 906 is coupled to the microcontroller 902 and is configured to receive the first and second fault signals FS1 and FS2 and indicate whether at least one of the first and second relays 106a and 106b is one of functional and faulty. In one embodiment, the fault indicator 906 includes the first and second fault indicators L1 and L2 to indicate whether the first and second relays 106a and 106b are functional or faulty in a similar manner as described in FIG. 2. In one example, the first and second fault indicators L1 and L2 are LEDs.

The microcontroller 902 is further configured to generate and provide to the controller 102 an alert signal AS based on the first and second fault signals FS1 and FS2 to indicate the status of the first and second relays 106a and 106b. In one embodiment, the microcontroller 102 may directly provide the first and second fault signals FS1 and FS2 instead of the alert signal AS to indicate that the first and second relays 106a and 106b are functional or fault, without deviating from the scope of the present disclosure.

The disclosed embodiments encompass numerous advantages. The disclosure provides various apparatus and methods for detecting faulty relays and switching between faulty and functional relays. The disclosed apparatus may facilitate several advantages for fault detection and automated redundancy in relays. Firstly, the apparatus provides a comprehensive solution with circuits that may be integrated into relays, allowing for convenient detection. The fault indicators, which may be light emitting diodes, offer a clear and intuitive means of communicating the detected fault in a relay. Additionally, the apparatus supports automatic switching from a faulty relay to a functional relay.

While various exemplary embodiments of the disclosed systems and methods have been described above, it should be understood that they have been presented for purposes of example only, and not limitations. It is not exhaustive and does not limit the disclosure to the precise form disclosed. Modifications and variations are possible in light of the above teachings or may be acquired from practicing of the disclosure, without departing from the breadth or scope.

While various embodiments of the disclosure have been illustrated and described, it will be clear that the disclosure is not limited to these embodiments only. Numerous modifications, changes, variations, substitutions, and equivalents will be apparent to those skilled in the art, without departing from the spirit and scope of the disclosure, as described in the claims.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Unless otherwise stated, conditional languages such as "can", "could", "will", "might", or "may" are understood within the context as used in general to convey that certain embodiments include, while other embodiments do not include, certain features, elements and/or steps. Thus, such conditional languages are not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

It will be understood by those within the art that, in general, terms used herein, are generally intended as "open" terms (e.g., the term "including" should be interpreted as "including but not limited to," the term "having" should be interpreted as "having at least," the term "includes" should be interpreted as "includes but is not limited to," etc.).

What is claimed is:

1. An apparatus, comprising:
a controller configured to generate a first control signal;
a first relay coupled to a load;
a fault detector coupled to the controller and the first relay and configured to receive the first control signal and generate a first fault signal, wherein, the fault detector further comprising:
  a first input coupled with the controller for receiving the first control signal;
  a first output coupled to the first relay for providing the first control signal to the first relay;
  a sensor to detect a presence and an absence of electricity flowing through the load and generate a detection signal; and
  a logic gate to compare the detection signal and the first control signal, wherein:
    when a logic level of the detection signal is the same as a logic level of the first control signal, the first fault signal indicates that the first relay is functional, and
    when the logic level of the detection signal is different from the logic level of the first control signal, the first fault signal indicates that the first relay is faulty.

2. The apparatus of claim 1, wherein each of the first and second relay comprises:
a first switch having a first contact; and
a second switch having a second contact coupled with the first contact by way of a non-conductive material, wherein:
  the first and second switches are activated and deactivated simultaneously, and
  the first switch controls a first circuit, and the second switch controls a second circuit including the load.

3. The apparatus of claim 1, wherein the fault detector comprises:
a fault indicator that is configured to receive the first fault signal and indicate a state of the first relay based on the first fault signal.

4. The apparatus of claim 3, wherein the fault indicator comprises a light emitting diode to indicate whether the first relay is functional or faulty.

5. The apparatus of claim 4, wherein the controller is further configured to receive the first fault signal.

6. The apparatus of claim 1, wherein the sensor comprises:
an antenna configured to detect the presence and the absence of electricity flowing through the load and generate the detection signal.

7. The apparatus of claim 1, wherein the sensor comprises a hall sensor.

8. The apparatus of claim 1, wherein the first relay is one of: an electromechanical relay, a solid state relay, or a single pole single throw relay.

9. The apparatus of claim 1, further comprising:
a second relay coupled to the load, wherein the fault detector is coupled to the second relay and further comprises a second output to provide a second control signal to the second relay, wherein the fault detector is configured to generate a second fault signal based on a comparison of the detection signal and the second control signal, wherein the second fault signal indicates whether the second relay is functional or faulty.

10. The apparatus of claim 1, wherein the fault detector further comprises a microcontroller.

11. An apparatus for detecting faults in relays, comprising:
a first input for receiving a first control signal for controlling a relay;
a first output for providing the first control signal to the relay;
a sensor to detect a presence and an absence of electricity flowing through a load controlled by the relay to generate a detection signal; and
circuitry configured to compare the detection signal and the first control signal and generate a fault signal indicating whether the relay is faulty, wherein:
  when a logic level of the detection signal is the same as a logic level of the first control signal, the fault signal indicates that the relay is functional, and
  when the logic level of the detection signal is different from the logic level of the first control signal, the fault signal indicates that the relay is faulty.

12. The apparatus of claim 11, further comprising a microcontroller, wherein the microcontroller comprises the circuitry configured to compare the detection signal and the first control signal and generate the fault signal indicating whether the relay is faulty.

13. The apparatus of claim 12, wherein the microcontroller comprises the first input and the first output.

14. The apparatus of claim 12, further comprising:
a fault indicator coupled to the microcontroller, wherein the fault indicator is responsive to the fault signal to visually indicate whether the relay is functional or faulty.

15. The apparatus of claim 14, wherein the fault indicator comprises an LED.

* * * * *